United States Patent
Kim et al.

(10) Patent No.: US 9,966,149 B2
(45) Date of Patent: *May 8, 2018

(54) OTP CELL WITH REVERSED MTJ CONNECTION

(71) Applicant: QUALCOMM Incorporated, San Diego, CA (US)

(72) Inventors: Jung Pill Kim, San Diego, CA (US); Taehyun Kim, San Diego, CA (US); Kangho Lee, San Diego, CA (US); Seung H. Kang, San Diego, CA (US); Xia Li, San Diego, CA (US); Wah Nam Hsu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/450,055

(22) Filed: Mar. 6, 2017

(65) Prior Publication Data

US 2017/0178741 A1   Jun. 22, 2017

Related U.S. Application Data

(60) Division of application No. 14/994,231, filed on Jan. 13, 2016, now Pat. No. 9,679,663, which is a continuation of application No. 13/613,168, filed on Sep. 13, 2012, now Pat. No. 9,245,610.

(51) Int. Cl.
  *G11C 11/00* (2006.01)
  *G11C 17/02* (2006.01)
  *G11C 11/16* (2006.01)

(52) U.S. Cl.
  CPC .......... *G11C 17/02* (2013.01); *G11C 11/1673* (2013.01); *G11C 11/1675* (2013.01)

(58) Field of Classification Search
  CPC .. G11C 17/02; G11C 11/1673; G11C 11/1675
  USPC ........................................................ 365/158
  See application file for complete search history.

(56) References Cited

U.S. PATENT DOCUMENTS

| 7,881,098 | B2 | 2/2011 | Xi et al. |
| 8,009,458 | B2 | 8/2011 | Lu et al. |
| 8,089,803 | B2 | 1/2012 | Katou |
| 9,245,610 | B2 | 1/2016 | Kim et al. |
| 2006/0018057 | A1 | 1/2006 | Huai |
| 2008/0247222 | A1 | 10/2008 | Jung et al. |
| 2010/0067293 | A1 | 3/2010 | Yu et al. |

(Continued)

FOREIGN PATENT DOCUMENTS

| CN | 1906701 A | 1/2007 |
| CN | 102074649 A | 5/2011 |
| WO | 2010101860 A2 | 9/2010 |

OTHER PUBLICATIONS

International Search Report and Written Opinion—PCT/US2013/059812—ISA/EPO—dated Oct. 25, 2013.

*Primary Examiner* — Anthan Tran
(74) *Attorney, Agent, or Firm* — Haynes and Boone, LLP (36340)

(57) ABSTRACT

A one time programming (OTP) apparatus unit cell includes magnetic tunnel junctions (MTJs) with reversed connections for placing the MTJ in an anti-parallel resistance state during programming. Increased MTJ resistance in its anti-parallel resistance state causes a higher programming voltage which reduces programming time and programming current.

7 Claims, 11 Drawing Sheets

(56) References Cited

U.S. PATENT DOCUMENTS

| | | |
|---|---|---|
| 2010/0074092 A1 | 3/2010 | Zhu et al. |
| 2010/0091546 A1* | 4/2010 | Liu .................... G11C 17/02 365/97 |
| 2010/0095057 A1 | 4/2010 | Li et al. |
| 2010/0208515 A1 | 8/2010 | Aoki et al. |
| 2010/0220516 A1* | 9/2010 | Lee .................... G11C 11/16 365/158 |
| 2011/0122674 A1 | 5/2011 | Lin et al. |
| 2011/0180861 A1 | 7/2011 | Iwayama |
| 2012/0044753 A1 | 2/2012 | Chung |
| 2016/0125953 A1 | 5/2016 | Kim et al. |

* cited by examiner

OTP CELL WITH REVERSED MTJ CONNECTION

CROSS-REFERENCE TO RELATED APPLICATIONS

This application is a divisional of U.S. application Ser. No. 14/994,231, filed Jan. 13, 2016, which is a continuation of U.S. application Ser. No. 13/613,168, filed Sep. 13, 2012.

TECHNICAL FIELD

The present disclosure generally relates to magnetic tunnel junction (MTJ) devices configured as one time programmable (OTP) devices. More specifically, the present disclosure relates to configuring MTJ devices with reversed connections OTP devices.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnitization direction that can be altered to represent either a "1" when the free layer magnetization is anti-parallel to the fixed layer magnetization or "0" when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnitization and fixed layer magnitization are parallel or anti-parallel with each other. A memory device such as MRAM is built from an array of individually addressable MTJs.

To write data in a conventional MRAM, a write current, which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current flows through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bitcell of the MRAM. The two different resistances represent a logic "0" and a logic "1" value stored by the MTJ.

Bitcells of a magnetic random access memory are generally arranged in one or more arrays including a pattern of memory elements (e.g., MTJs in case of MRAM). STT-MRAM (Spin-Transfer-Torque Magnetic Random Access Memory) is an emerging nonvolatile memory that has advantages of non-volatility, comparable speed to eDRAM (Embedded Dynamic Random Access Memory), smaller chip size compared to eSRAM (Embedded Static Random Access Memory), unlimited read/write endurance, and low array leakage current.

BRIEF SUMMARY

Aspects of the present disclosure include a one time programmable (OTP) apparatus including an access transistor coupled to a fixed potential, a first magnetic tunnel junction (MTJ) device coupled between the access transistor and a first bit line in a unit cell of the OTP apparatus. The OTP apparatus also includes a second MTJ device, coupled between the access transistor and a second bit line in the unit cell, and programming circuitry coupled to the first MTJ device and to the second MTJ device. The programming circuitry is configured for selecting between the first MTJ device and the second MTJ device to apply a sufficient voltage to break down a barrier layer associated with the selected MTJ device.

According to another aspect, the present disclosure includes a method for implementing a unit cell of an OTP apparatus. The method includes enabling a first programming driver to apply a voltage across only a first magnetic tunnel junction (MTJ) and an access transistor coupled in series. The method may also include enabling a second programming driver to apply a voltage across only a second MTJ device and the access transistor coupled in series.

In yet another aspect, an OTP apparatus includes means for enabling a first programming driver to apply a voltage across only a first magnetic tunnel junction (MTJ) and an access transistor coupled in series. The OTP apparatus may also include means for enabling a second programming driver to apply a voltage across only a second MTJ device and the access transistor coupled in series.

According to another aspect, the present disclosure includes a method for forming a one time programmable (OTP) cell. The method includes coupling an access transistor to a fixed potential, coupling a first magnetic tunnel junction (MTJ) device between the access transistor and a first bit line in a unit cell of the OTP apparatus, coupling a second MTJ device coupled between the access transistor and a second bit line in the unit cell, and coupling programming circuitry to the first MTJ device and to the second MTJ device. The programming circuitry is configured for selecting between the first MTJ device and the second MTJ device to apply a sufficient voltage to break down a barrier layer associated with the selected MTJ device.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
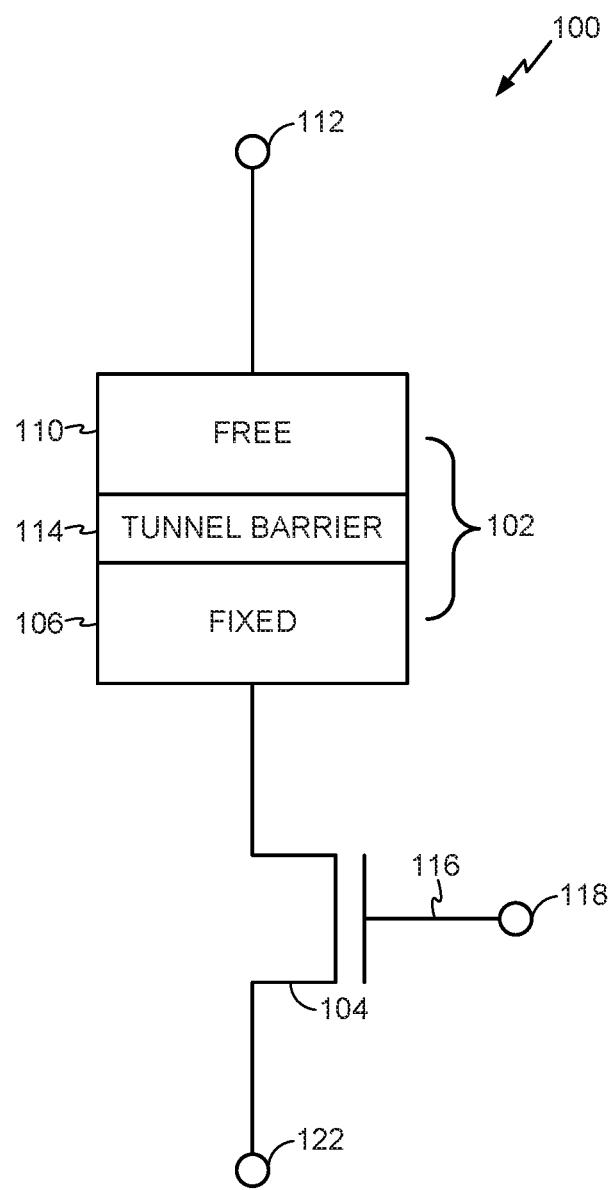
FIG. 1 is a diagram of a magnetic tunnel junction (MTJ) device connected to an access transistor.

FIG. 1 illustrates a one time programmable (OTP) device 100 including a magnetic tunnel junction (MTJ) 102 coupled to an access transistor 104. A free layer 110 of the MTJ 102 is coupled to a bit line 112. The access transistor 104 is coupled between a fixed layer 106 of the MTJ 102 and a fixed potential node 122. A tunnel barrier layer 114, is coupled between the fixed layer 106 and the free layer 110. The access transistor 104 includes a gate 116 coupled to a word line 118.

The OTP device 100 has a pre-programmed high resistance state and a programmable low resistance state. In the pre-programmed high resistance state the OTP structure exhibits resistance in the kilo-ohm order of magnitude. In the programmable low resistance state the tunnel barrier layer 114 is broken down during an anti-fuse programming so that the OTP structure exhibits resistance in the hundred ohm order of magnitude. The OTP device 100 is programmable by applying a sufficiently high voltage across the MTJ 102 to break down the tunnel barrier layer 114. For example a program voltage of about 1.8 volts may be applied to break down the tunnel barrier layer.

Synthetic anti-ferromagnetic materials may be used to form the fixed layer 106 and the free layer 110. For example, the fixed layer 106 may comprise multiple material layers including a CoFeB, and Ru layer and a CoFe layer. The free layer 110 may be a anti-ferromagnetic material such as CoFeB, and the tunnel barrier layer 114 may be MgO, for example.

Figure 2:
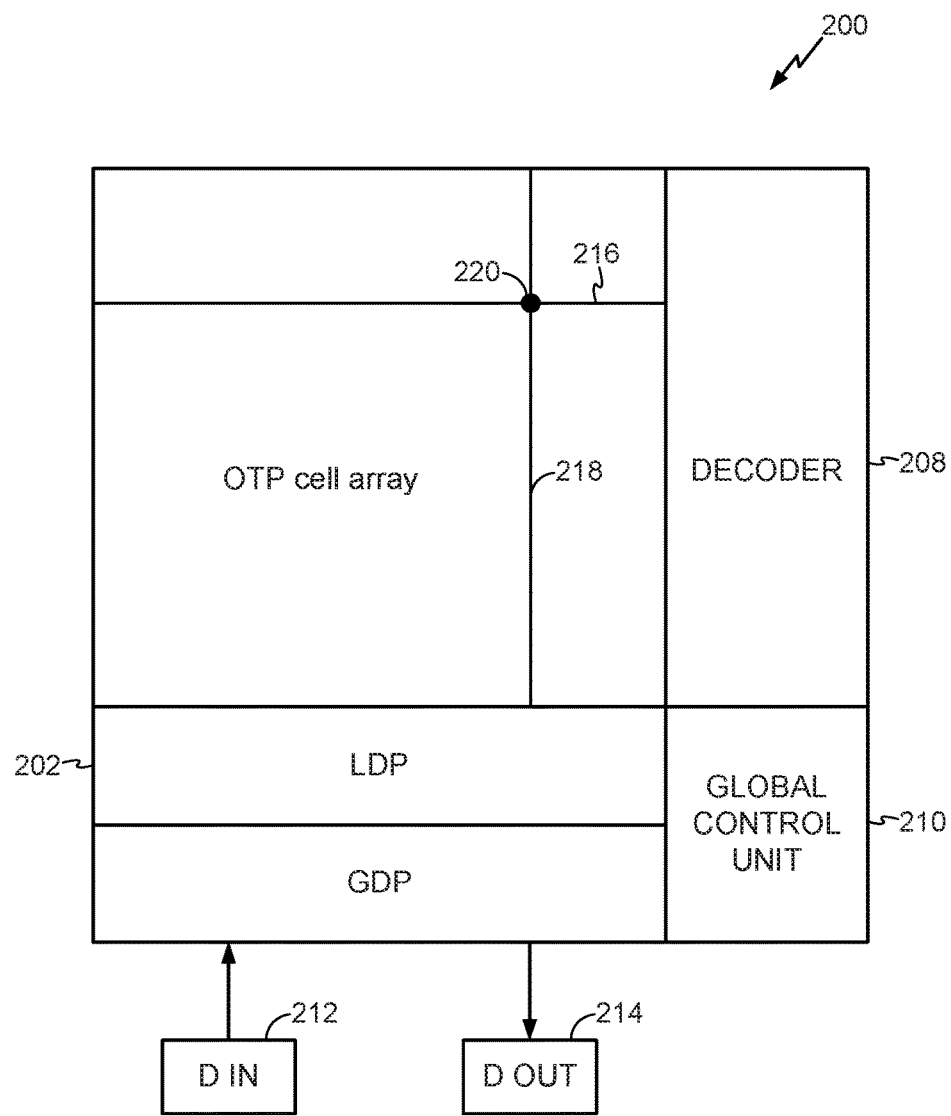
FIG. 2 is a diagram of an one time programming (OTP) device.

FIG. 2 illustrates an OTP memory macro 200. The macro 200 may include a local data path (LDP) 202, a global data path (GDP) 204, a cell array 206, a decoder 208, and a global control unit 210. The LDP 202 includes one or more sense amplifiers and a programming write driver (not shown). The GDP 204 includes circuitry for input and output signal lines or pins, such as a DIN 212 and a DOUT 214. The GDP 204 may also include ECC circuitry (not shown).

The cell array 206 includes multiple rows corresponding to word lines, for example a WL 216 and multiple columns corresponding to bit lines, for example a bit line 218. For example, the cell array 206 may have 64 rows for word lines and 256 bits for bit lines. The cell array 206 includes numerous unit cells such as a unit cell 220, coupled to the word line 216 and the bit line 218. Each unit cell includes an OTP device 100 as described with reference to FIG. 1.

Figure 3:
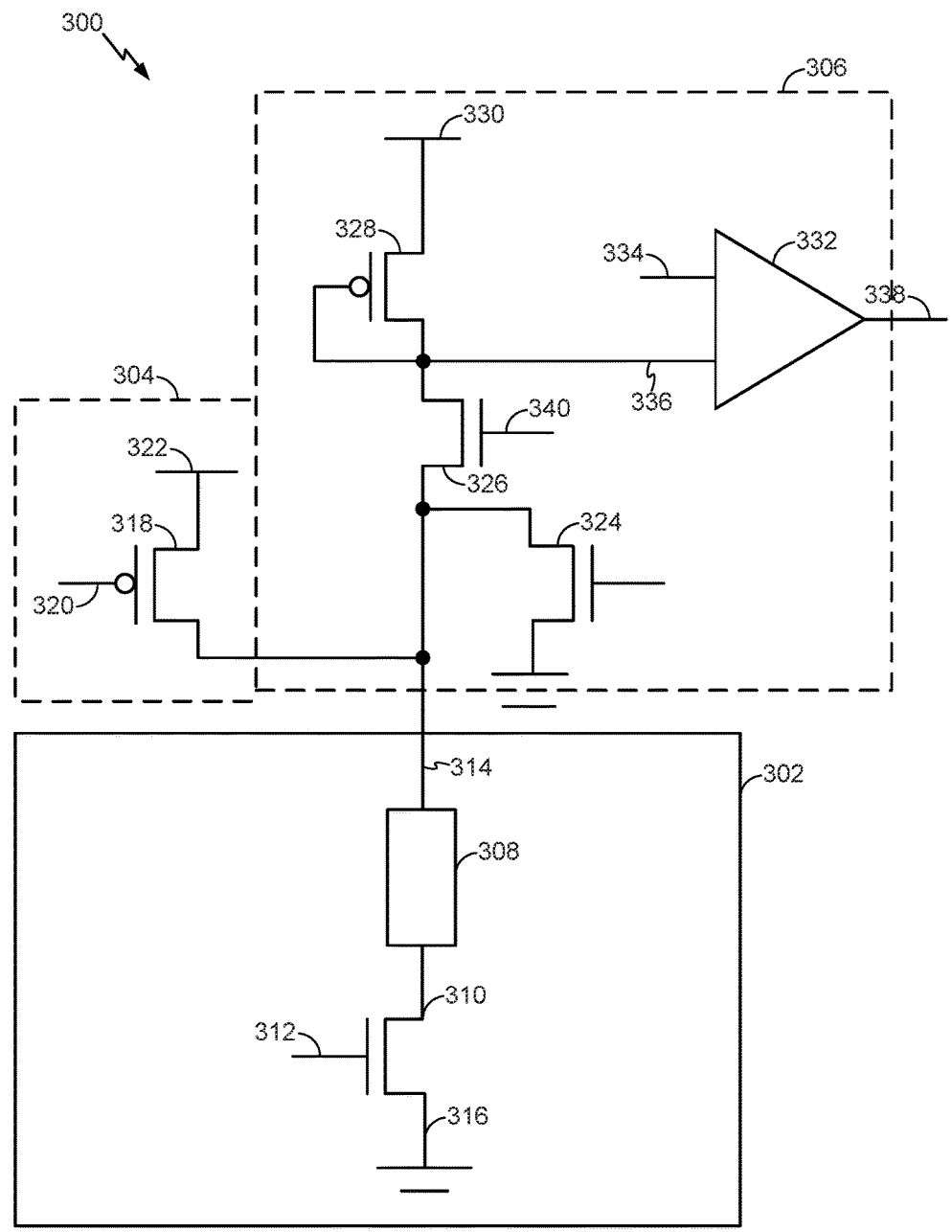
FIG. 3 is a diagram of an MTJ device and circuitry for programming and reading the MTJ device.

FIG. 3 illustrates programming and sensing circuitry 300 for programming a unit cell including an OTP device 302. The programming and sensing circuitry 300 includes programming driver circuitry 304, and sensing circuitry 306. The OTP device 302 includes an MTJ 308 coupled to a bit line 314 and an access transistor 310 coupled between the MTJ 308 and a fixed potential node 316. A word line 312 is coupled to the access transistor 310. The programming driver circuitry 304 includes a programming transistor 318 coupled between a first source node 322 and the bit line 314 and a programming enable node 320 coupled to the programming transistor 318.

The sensing circuitry 306 includes a read sense amplifier transistor 328 coupled between a second source node 330 and a sense input node 336 of a sense amplifier 332. The second source node 330 may be the same node or the same potential as the first source node 322 or may be coupled to a different potential than the first source node 322. The sense amplifier 332 also includes a reference node 334 and an output node 338. A read enable transistor 326 is coupled between the sense input node 336 and the bit line 314. A read enable node 340 is coupled to the read enable transistor 326. A precharge transistor 324 is coupled between the bit line 314 and the fixed potential 316.

During a programming operation of the unit cell 302, a programming enable signal is applied to the programming enable node 320, which allows sufficient voltage across the MTJ 308 to breakdown the tunnel barrier layer of the MTJ.

During a read operation of the unit cell 302, the programming enable signal 320 of the programming driver 304 is off and thus, does not supply any voltage to the bit line 314. A read enable signal is applied to the read enable node 340 which turns on the read enable transistor 326 and allows a read current to flow through the MTJ 308. The resistance of the MTJ 308 is sensed by the sense amplifier 332 by comparing the a voltage on the reference node 334 with voltage on the sense input node 336.

Figure 4A:
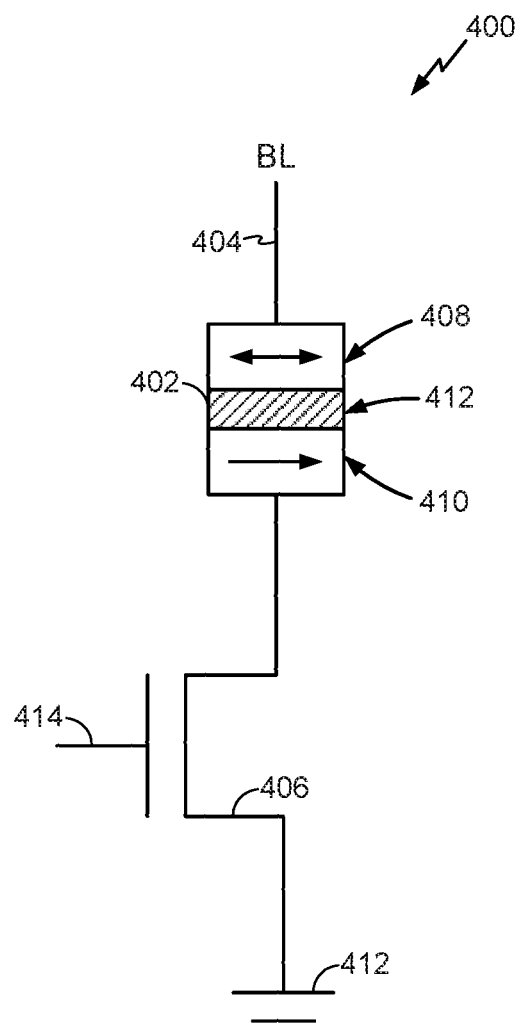
FIG. 4A is a schematic circuit diagram of an OTP cell including a usual MTJ configuration.

FIG. 4A illustrates an OTP cell 400 including an MTJ 402 coupled in a usual configuration between a bit line 404 and an access transistor 406. In the usual configuration, the MTJ 402 includes a free layer 408, coupled to the bit line 404 and a pinned layer 410 coupled to the access transistor 406. A tunnel barrier layer 412 is coupled between the free layer 408 and the pinned layer 410. The access transistor 406 is coupled between the pinned layer 410 and a fixed potential node 420. A word line 414 is coupled to a gate of the access transistor 406.

Figure 4B:
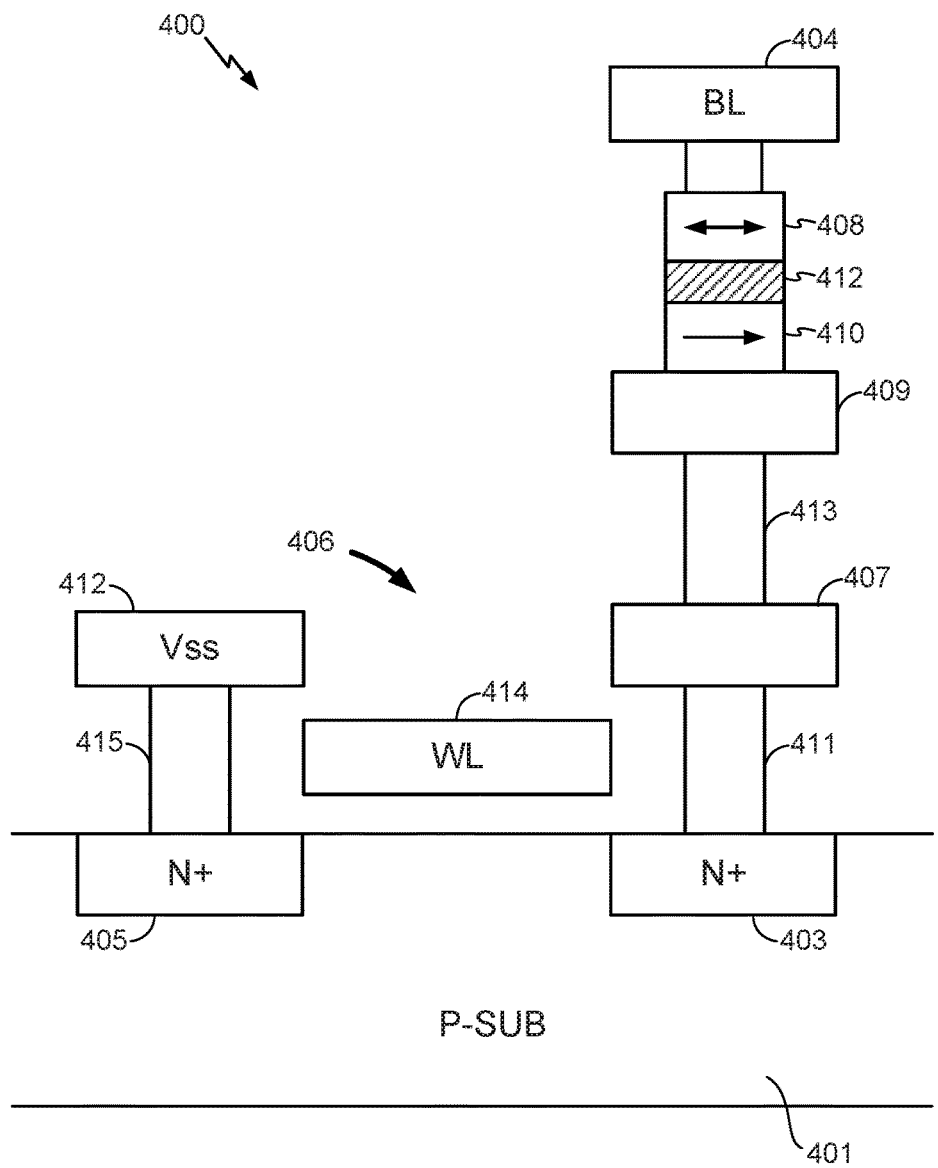
FIG. 4B is a physical layout diagram of an OTP cell including a usual MTJ configuration.

The physical layout of the OTP cell 400 in a usual configuration is described with reference to FIG. 4B. The access transistor 406 includes two N+ regions 403, 405 in a p-sub layer 401. The word line 414 is configured over a gate portion of the access transistor 406 between the two N+ regions 403, 405. One or more conductive layers 407, 409 and one or more vias 411, 413 couple the pinned layer 410 of the MTJ 402 to one of the N+ regions 403. Another via 415 couples the other N+ region 405 to the fixed potential node 420. In general, the pinned layer 410 of an MTJ 402 is formed and placed under the tunnel barrier layer 412 and free layer 408. The free layer 408 is generally coupled to a bit line 404 above it.

Figure 5A:
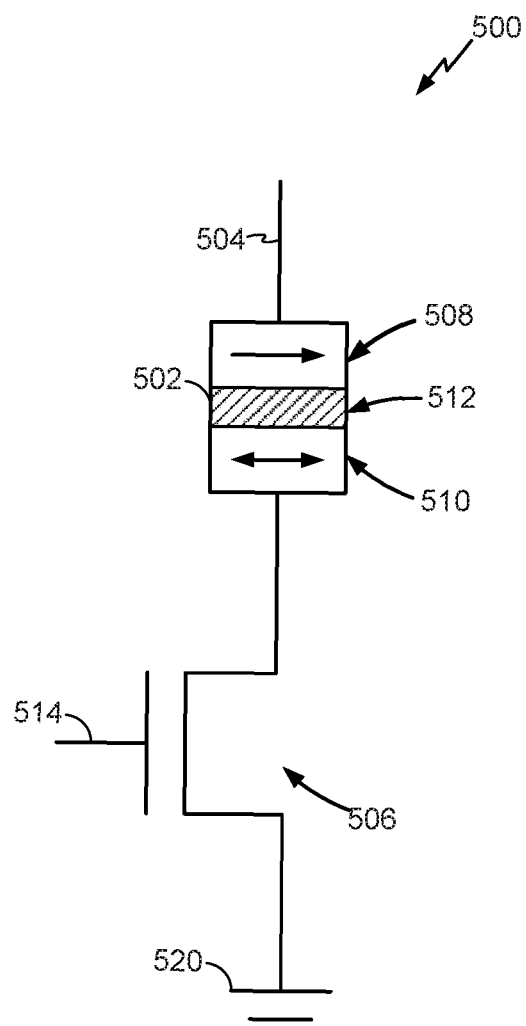
FIG. 5A is a schematic circuit diagram of an OTP cell including reversed connections according to aspects of the present disclosure.

According to aspects of the present disclosure the layout of the MTJ pinned layer and fixed layer is physically reversed compared to a usual MTJ configuration. FIG. 5A illustrates an OTP cell 500 according to an aspect of the present disclosure including an MTJ 502 coupled in a reversed configuration between a bit line 504 and an access transistor 506. In the reversed configuration, the MTJ 502 includes a pinned layer 508, coupled to the bit line 504 and a free layer 510 coupled to the access transistor 506. A tunnel barrier layer 512 is coupled between the pinned layer 508 and the free layer 510. The access transistor 506 is coupled between the free layer 510 and a fixed potential node 520. A word line 514 is coupled to a gate of the access transistor 506.

Figure 5B:
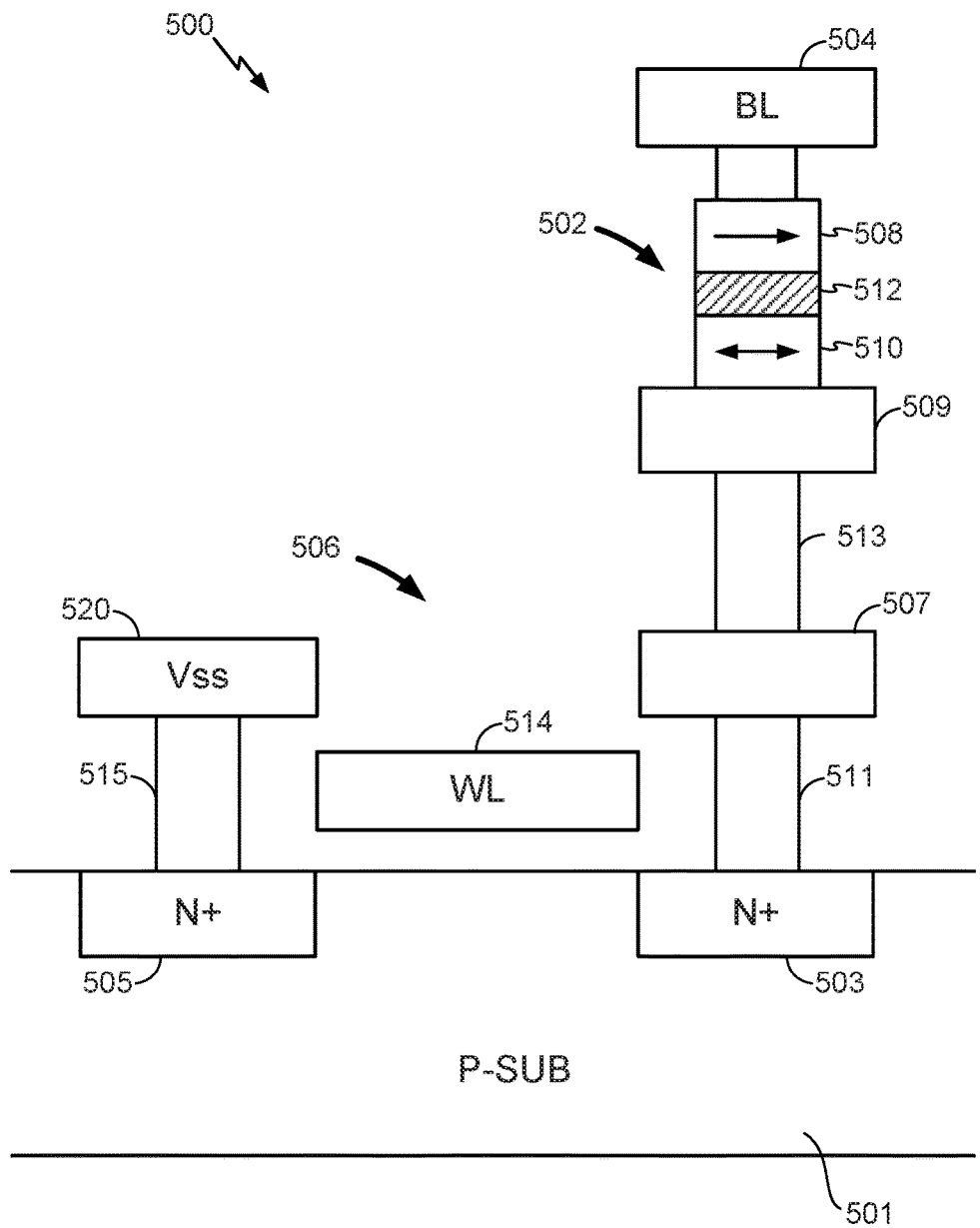
FIG. 5B is a physical layout diagram of an OTP cell including reversed connections according to an aspect of the present disclosure.

The physical layout of the OTP cell 500 in the reversed configuration according to aspects of the present is described with reference to FIG. 5B. The access transistor 506 includes two N+ regions 503, 505 in a p-sub layer 501. The word line 514 is configured over a gate portion of the access transistor 506 between the two N+ regions 503, 505. One or more conductive layers 507, 509 and one or more vias 511, 513 couple the free layer 510 of the MTJ 502 to the N+ region 503. Another via 515 couples the other N+ region 505 to the fixed potential node 520. In this reversed configuration, the free layer 510 of the MTJ 502 is formed and placed under the tunnel barrier layer 512 and pinned layer 508. The pinned layer 508 is coupled to a bit line 504 above it.

By configuring the MTJ with reversed connections according to aspects of the present disclosure, the high bit line voltage applied during programming the OTP cell first switches the MTJ to its anti-parallel resistance (RAP) state before breaking down the tunnel barrier layer. The MTJ resistance in its RAP state is higher than in its parallel resistance (RP) state so the voltage across the MTJ is higher during programming. The increased voltage across the MTJ during programming decreases the programming time and the programming current for programming the OTP cell.

The physical layout of the OTP cell 500 in the reversed configuration according to another aspect of the present is described with reference to FIG. 5C. The access transistor 506 includes two N+ regions 503, 505 in a p-sub layer 501. The word line 514 is configured over a gate portion of the access transistor 506 between the two N+ regions 503, 505. One or more conductive layers 507, 509, 517 and one or more vias 511, 513, 519 couple the free layer 510 of the MTJ 502 to one of the N+ regions 503. Another via 515 couples the other N+ region 505 to the fixed potential node 520. In this alternative reversed configuration, the free layer 510 of the MTJ 502 is formed and placed under the tunnel barrier layer 512 and pinned layer 508. The pinned layer 508 is coupled to a bit line 504 above it.

Figure 5C:
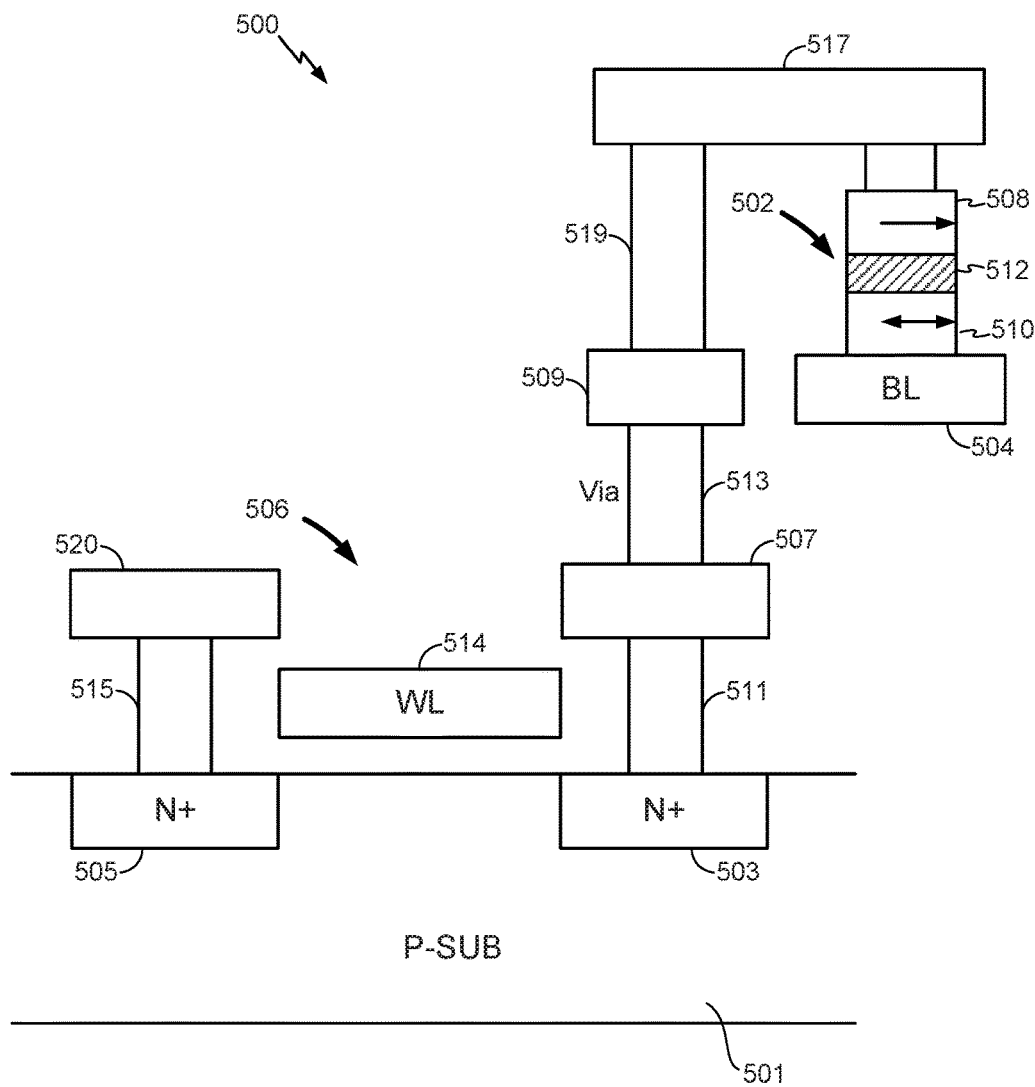
FIG. 5C is a physical layout diagram of an OTP cell including reversed connections according to an aspect of the present disclosure.

According to the aspect of the present disclosure shown in FIG. 5C, the layout of the MTJ pinned layer and free layer is not physically reversed compared to a usual MTJ configuration. However, the electrical connections to the MTJ are reversed compared to a usual configuration. The reversed electrical connection switches the MTJ to its RAP state and thereby reduces programming time and programming current in the same manner as the configuration shown in FIG. 5B.

Figure 6:
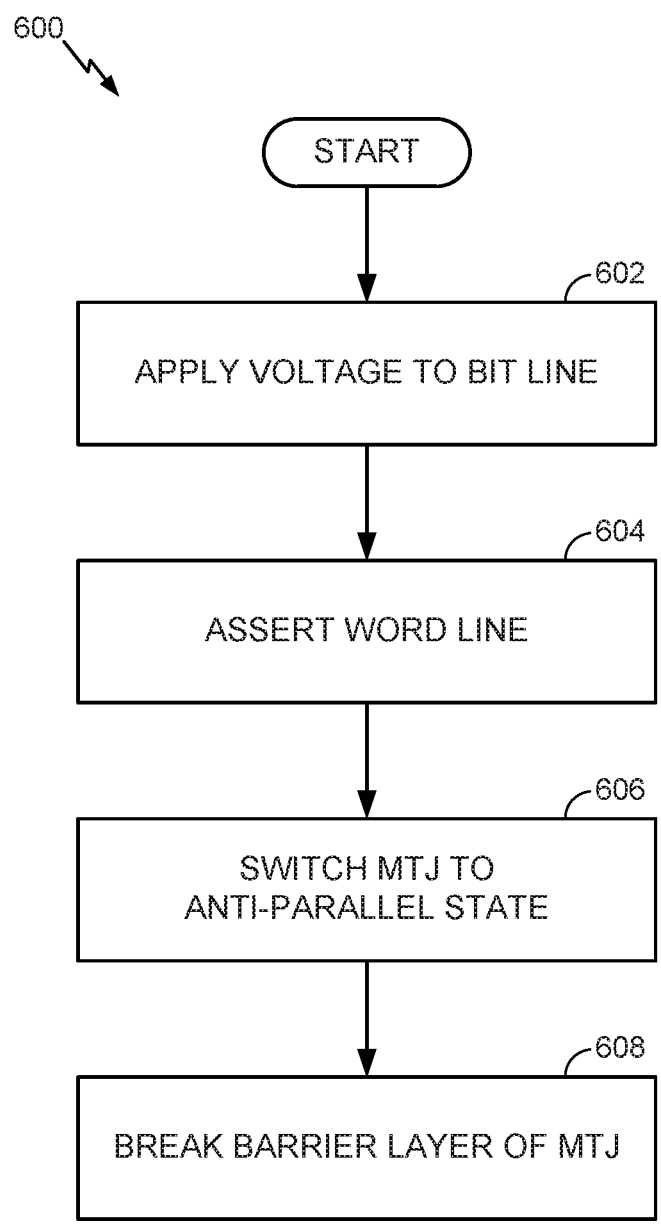
FIG. 6 is process flow diagram illustrating a method of programming an OTP device according to aspects of the present disclosure.

FIG. 6 is a process flow diagram illustrating a method of programming a one time programming (OTP) device according to an aspect of the present disclosure. The method 600 includes, applying a voltage to a bit line at block 602, asserting a word line to enable an access transistor at block 604, and switching an MTJ to anti-parallel (AP) state at block 606 in response to the applied voltage. According to an aspect of the disclosure the method also includes in block 608 breaking a barrier layer of the MTJ after switching the MTJ state in response to applying the voltage.

An apparatus for programming an OTP cell according to another aspect of the present disclosure includes means for applying a voltage to a bit line, means for asserting a word line to enable an access transistor and means for switching an MTJ state to an anti-parallel resistance state in response to applying the voltage. According to this aspect of the present disclosure, the apparatus also includes means for breaking a barrier layer of the MTJ after switching state in response to applying the voltage. The means for applying a voltage to a bit line, means for switching an MTJ state to AP in response to applying the voltage and means for breaking a barrier layer of the MTJ after switching state in response to applying the voltage may include circuitry such as programming driver circuitry 304 as shown in FIG. 3, for example. The means for asserting a word line to enable an access transistor may include decoder circuitry 208 as shown in FIG. 2, for example.

In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 7:
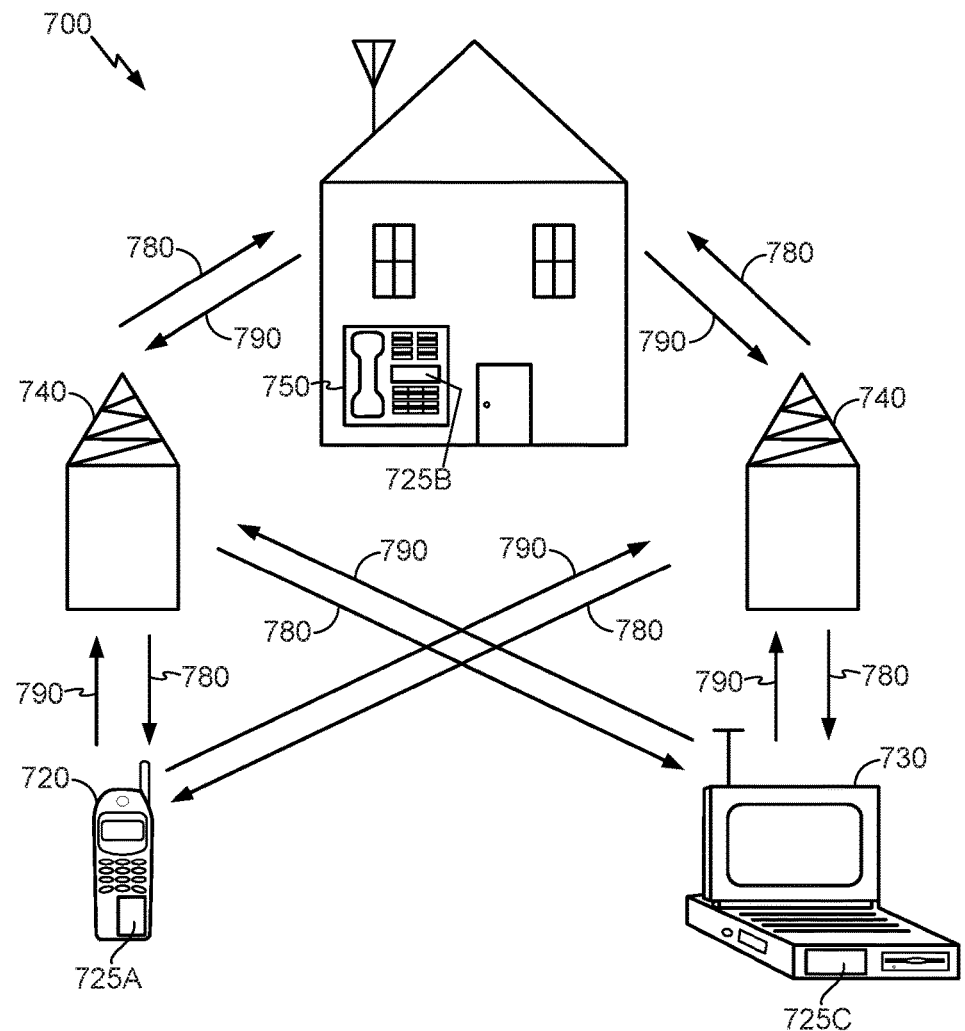
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C and 725B that include the disclosed one time programming (OTP) apparatus. It will be recognized that other devices may also include the disclosed one time programming (OTP) apparatus, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 7 illustrates remote units according to the teachings of the disclosure, the disclosure is not limited to these exemplary illustrated units. Aspects of the disclosure may be suitably employed in many devices which include the disclosed one time programming (OTP) apparatus.

Figure 8:
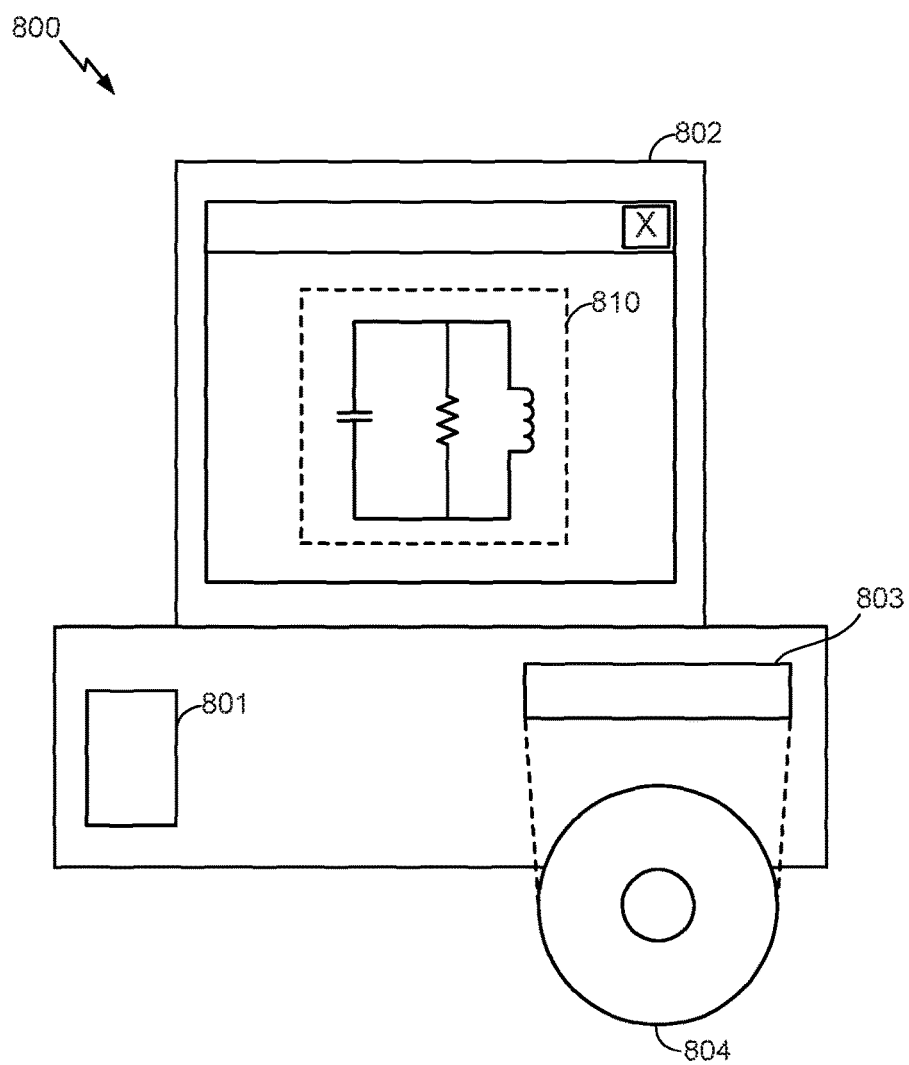
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the one time programming (OTP) apparatus disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as an one time programming (OTP) apparatus. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A method of programming an anti-fuse magnetic tunnel junction (MTJ) memory cell, comprising:
   biasing a free layer for the anti-fuse MTJ memory cell to be negative in voltage with respect to a fixed layer for the anti-fuse MTJ memory cell to force a state of the anti-fuse MTJ memory cell to be an anti-parallel (AP) state; and
   breaking down a dielectric barrier layer of the anti-fuse MTJ memory cell while the anti-fuse MTJ memory cell is in the AP state.

2. The method of claim 1, wherein switching the state of the anti-fuse MTJ memory cell comprises:
   grounding a free layer of the anti-fuse MTJ memory cell to ground while charging a pinned layer of the anti-fuse MTJ memory cell to a positive voltage.

3. The method of claim 2, wherein grounding the free layer comprises switching on an access transistor to couple the free layer to ground through the access transistor.

4. The method of claim 2, wherein charging the pinned layer comprises charging to the positive voltage a bit line coupled to the pinned layer.

5. The method of claim 1, further comprising integrating the anti-fuse MTJ memory cell into a mobile phone, a set top box, a music player, a video player, an entertainment unit, a navigation device, a computer, a hand-held personal communication systems (PCS) unit, a portable data unit, and/or a fixed location data unit.

6. A method of programming an anti-fuse magnetic tunnel junction (MTJ) memory cell, comprising:
   charging a pinned layer of the anti-fuse MTJ memory cell to a voltage that is greater than a voltage of a free layer of the anti-fuse MTJ memory cell to force the anti-fuse MTJ memory cell into an anti-parallel state; and while the anti-fuse MTJ memory cell is in the anti-parallel state; maintaining the voltage of the pinned layer higher than the voltage of the free layer until a dielectric barrier layer in the anti-fuse MTJ memory cell is broken down.

7. The method of claim 6, further comprising a step of integrating the anti-fuse MTJ memory cell into a mobile phone, a set top box, a music player, a video player, an entertainment unit, a navigation device, a computer, a handheld personal communication systems (PCS) unit, a portable data unit, and/or a fixed location data unit.

\* \* \* \* \*